United States Patent [19]
Nakatani et al.

[11] Patent Number: 5,099,240
[45] Date of Patent: Mar. 24, 1992

[54] SUBRANGING ADC WITH ERROR CORRECTION THROUGH INCREASED FINE STEP SPAN AND NOISE REDUCING LAYOUT

[75] Inventors: Yuuichi Nakatani, Mitaka; Hironori Miyake, Yokohama, both of Japan

[73] Assignee: Motorola Inc., Schaumburg, Ill.

[21] Appl. No.: 583,632

[22] Filed: Sep. 17, 1990

[51] Int. Cl.⁵ .............................................. H03M 1/14
[52] U.S. Cl. ..................................... 341/156; 341/154; 341/158
[58] Field of Search ............... 341/154, 155, 156, 158, 341/159

[56] References Cited

U.S. PATENT DOCUMENTS

| | | | |
|---|---|---|---|
| 4,533,903 | 8/1985 | Yamada et al. | 341/156 |
| 4,568,910 | 2/1986 | Sekino et al. | 341/156 |
| 4,599,599 | 7/1986 | Sekino et al. | 341/156 |
| 4,612,531 | 9/1986 | Dingwall et al. | 341/156 |
| 4,635,036 | 1/1987 | Yoshizawa | 341/156 |
| 4,733,217 | 3/1988 | Dingwall | 341/156 |
| 4,745,393 | 5/1988 | Tsukada et al. | 341/156 |
| 4,849,759 | 7/1989 | Hughes | 341/156 |
| 4,903,028 | 2/1990 | Fukushima | 341/156 |
| 4,912,470 | 3/1990 | Hosotani et al. | 341/159 |

*Primary Examiner*—Howard L. Williams
*Attorney, Agent, or Firm*—Robert Atkins; Eugene A. Parsons

[57] ABSTRACT

A multiple-clock-cycle subranging type A/D converter utilizing sufficient fine steps in the LSB identification to cover two complete coarse steps so that there are no gaps in the fine steps and no potential errors. Also, two LSB encoders can be utilized, one during each clock cycle, to increase the speed of the A/D converter. The components of the A/D converter are positioned on a semiconductor chip so that noise from electronic switches is not introduced into the reference voltage ladder.

12 Claims, 6 Drawing Sheets

SUBRANGING ADC WITH ERROR CORRECTION THROUGH INCREASED FINE STEP SPAN AND NOISE REDUCING LAYOUT

The present invention pertains to Multiple-clock-cycle subranging analog-to-digital (A/D) converters and more specifically to low error, high speed multiple-clock cycle subranging A/D converters.

BACKGROUND OF THE INVENTION

Low cost monolithic megahertz rate A/D converters are critical building blocks for many digital signal processing applications. There are generally two types of A/D converters: the single-clock-cycle flash type and the multiple-clock-cycle subranging type. Both of these types include basically the same types of components, which include reference voltage ladders, comparators and apparatus for combining the outputs of the comparators into a digital signal. The major difference is that flash type A/D converters require a comparator for each division of the reference voltage ladder, i.e. each division representing a most significant bit (MSB) and each division representing a least significant bit (LSB) between each of the MSBs. Whereas, subranging type A/D converters only require a comparator for each MSB and a comparator for each LSB between approximately a single pair of MSBs. A plurality of electronic switches are provided to switch the LSB comparators to the portion of the reference voltage ladder which most nearly compares to the unknown voltage being digitized. This substantial reduction in the number of comparators greatly reduces the chip size.

There are several problems in the subranging type of A/D converters, including of course the fact that they require multiple clock cycles, which reduces them to a fraction of the speed of the flash type A/D converter. Also, because of the electronic switches and excess wiring required, switching and other noise is introduced into the signal channel, which causes some reduction in the accuracy. Much of this switching noise is introduced into the reference voltage ladder by each switching line crossing the reference voltage ladder. Further, the LSB comparators utilized do not cover certain steps, or areas, of the MSBs so that errors can occur at particular voltage levels.

SUMMARY OF THE INVENTION

It is an object of the present invention to provide a new and improved subranging type of A/D converter.

It is a further object of the present invention to provide a new and improved subranging type of A/D converter, and method of manufacture, wherein the internally generated noise due to switching and the like is greatly reduced.

It is a further object of the present invention to provide a new and improved subranging type of A/D converter, and method of conversions, that is more accurate than prior art types.

It is a further object of the present invention to provide a new and improved subranging type of A/D converter, and method of conversions, that is faster than prior art subranging types of A/D converters.

These and other objects are realized in a multiple-clock-cycle subranging type A/D converter including a plurality of voltage comparators, a reference voltage ladder having a plurality of coarse steps with a first group of voltage comparators connected thereto and a plurality of fine steps within the coarse steps, electronic switches connected to the voltage comparators and to the reference voltage ladder, an MSB encoder receiving signals from the first group of comparators indicative of the approximate coarse step that coincides with the unknown voltage and connecting a second group of comparators to the fine steps of the reference voltage ladder within and adjacent the indicated coarse step, the second group of voltage comparators and connected fine steps including twice as many voltage comparators and fine steps as are included in a single coarse step, an LSB encoder coupled to the MSB encoder and the second group of voltage comparators, and an output buffer connected to the MSB and LSB encoders for providing a multiple bit digital output signal which is indicative of the level of the unknown input voltage, whereby the second group of comparators of the converter can be switched over the entire range of the reference voltage ladder.

In another embodiment, a third group of voltage comparators is provided and alternated with the second group to provide an output every clock cycle.

In another embodiment, the reference voltage ladder is constructed in a separate area on the semiconductor chip so that no connecting lines cross over any portion of the reference voltage ladder.

BRIEF DESCRIPTION OF THE DRAWINGS

Referring to the drawings.

DESCRIPTION OF THE PREFERRED EMBODIMENTS

Figure 1:
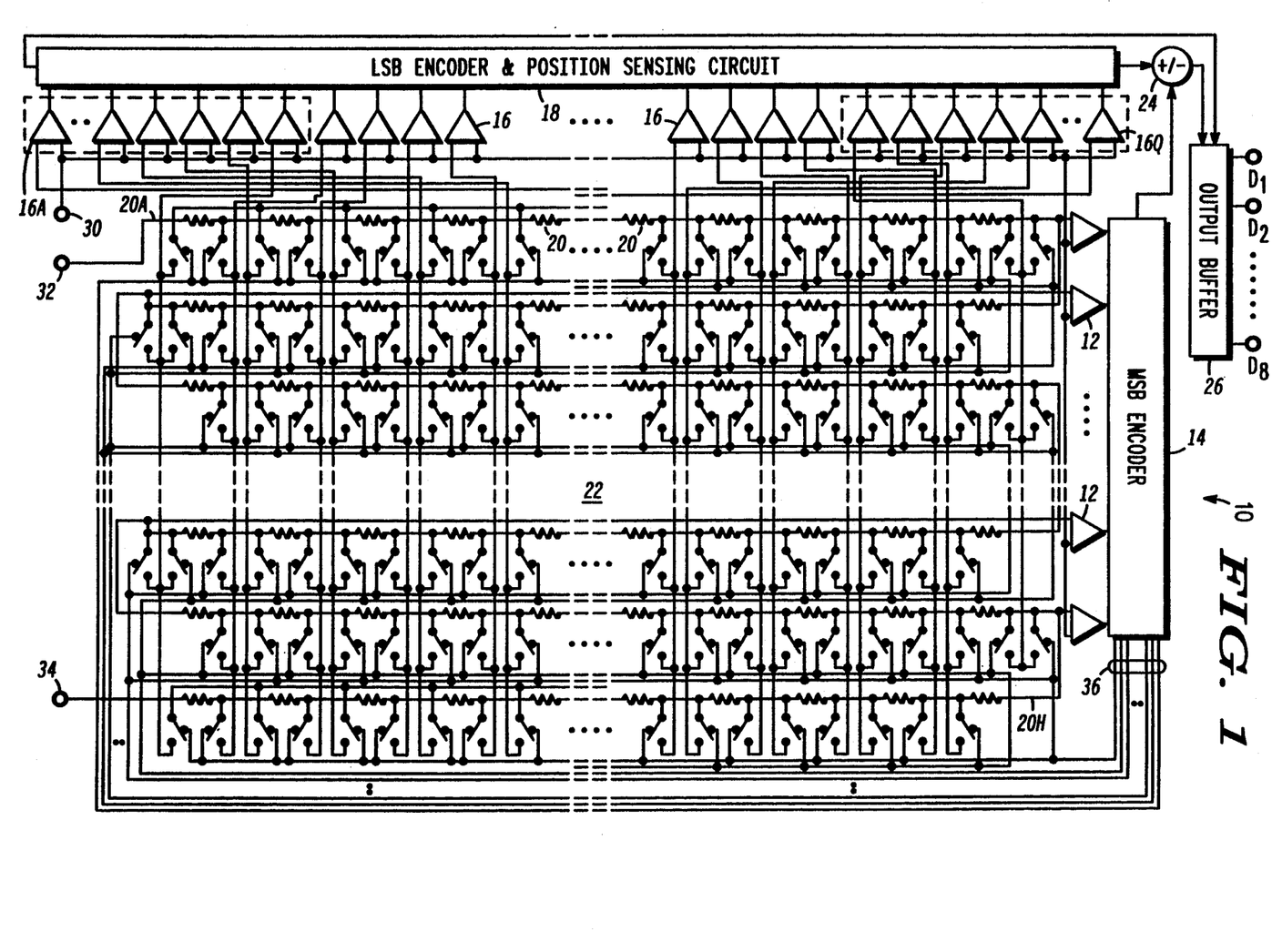
FIG. 1 is a schematic diagram of a subranging A/D converter embodying the present invention.

Referring specifically to FIG. 1, a multiple-clock-cycle subranging A/D converter 10 embodying the present invention is illustrated. A/D converter 10 includes a first group of voltage comparators 12 and an encoder 14 for determining the MSB, a second group of voltage comparators 16 and an encoder 18 for determining the LSB, a reference voltage ladder 20 and a network of electronic switches 22 connecting second group of voltage comparators 12 to reference voltage ladder 20. The outputs of MSB encoder 14 and LSB encoder 18 are supplied to an MSB correction circuit 24 and the output of circuit 24 is supplied with the output of LSB encoder 18 to an output buffer 26.

Each individual voltage comparator in first and second groups of voltage comparators 12 and 16 is, preferably, a low noise voltage comparator similar to that described in a copending patent application entitled "Voltage Comparator With Sample Hold Circuit", filed on July, 5, 1990, U.S. Ser. No. 548,529, and assigned to the same assignee. However, any of the well known voltage comparators used in the "flash" and "subranging" A/D converters can be utilized, if desired. Also, while a simple one-pole single-throw switch is illustrated for each of the electronic switches in network 22, to simplify the drawings, it should be understood that these switches will generally be some type of semiconductor switch, such as the well known transmission gate type of switch. A/D converter 10 is integrated on a single semiconductor chip generally as laid out schematically in FIG. 1 with reference voltage ladder 20, switch network 22 and all of the connecting wiring distributed as illustrated.

First group of voltage comparators 12 is connected directly to a plurality of coarse steps of reference voltage ladder 20. For example, the present embodiment is illustrated as providing a six bit output signal, with three bits representing the MSB and three bits representing the LSB. Thus, the reference voltage ladder is divided into eight coarse steps designated 000 through 111 and each coarse step is divided into eight fine steps. In the usual system providing eight-bit accuracy, eight fine resistors are positioned between each pair of coarse resistors (a total of 64 resistors) to form the reference ladder. However, in some systems only eight fine resistors plus some for extension into adjacent coarse steps, are used and a switching system connects the fine resistors to different points in the coarse resistor ladder. One of the switches of switching network 22 (a total of 128 switches in this embodiment) is connected to each end of each resistor in reference ladder 20 and to one of the voltage comparators in the second group of voltage comparators 16. A control input of each of the switches is connected to a control signal output of MSB encoder 14.

An input voltage terminal 30 is adapted to have applied thereto an analog signal (unknown voltage) which it is desired to digitize. Terminal 30 is connected to one input of each of the voltage comparators in first group 12 and second group 16. A first reference voltage terminal 32 is connected to one end of reference voltage ladder 20 and a second reference voltage terminal 34 is connected to the other end of reference voltage ladder 20. Generally, terminal 32 will have a high potential applied thereto and terminal 34 will have a low potential applied thereto, e.g. ground. A plurality of control lines 36 are connected between the output of MSB encoder 14 and the control inputs of the electronic switches.

Figure 2:
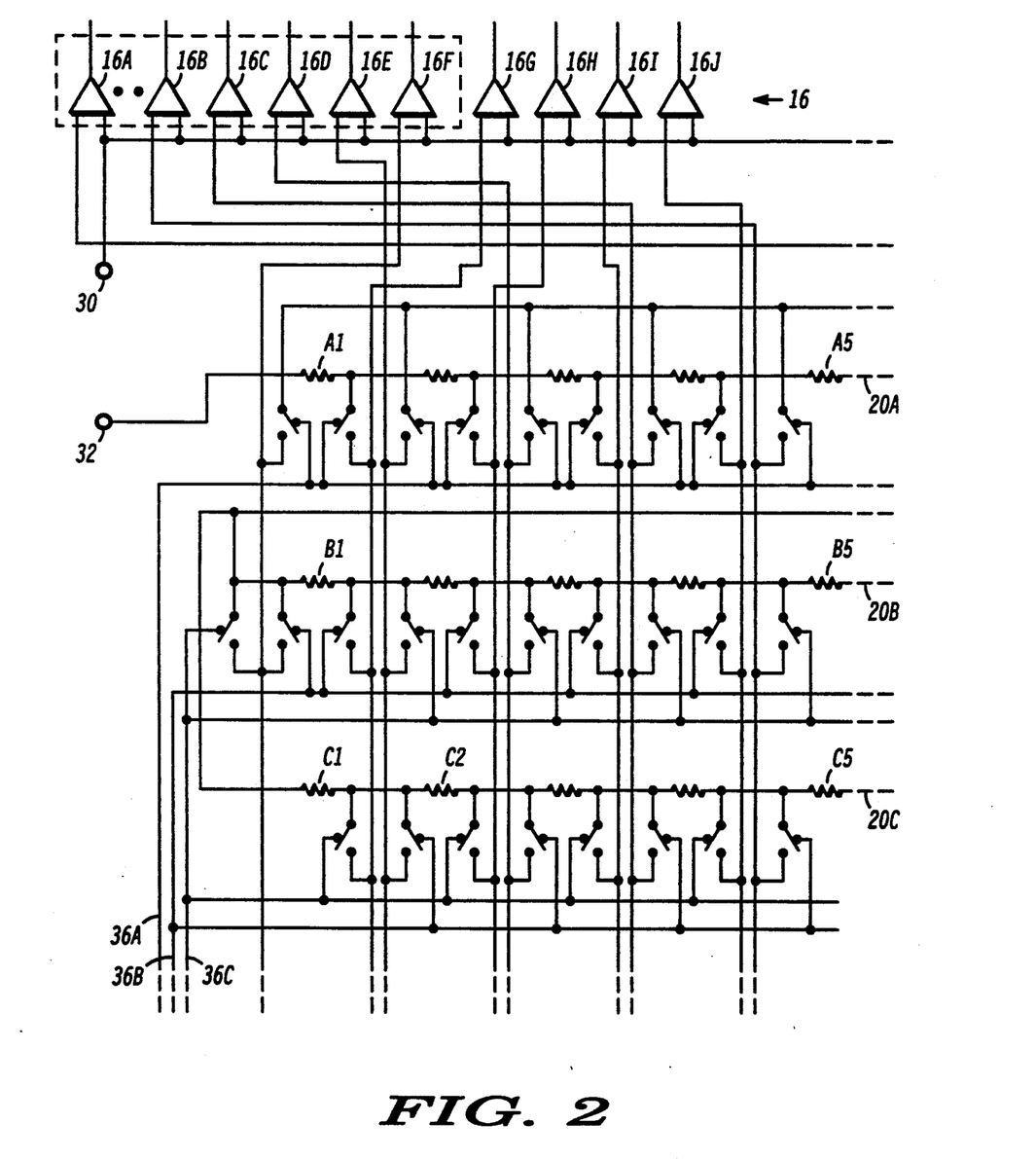
FIG. 2 is an enlarged schematic diagram of a portion of FIG. 1 illustrating the reference voltage ladder and electronic switch connections in more detail.

Referring to FIG. 2, a portion of switching network 22 and reference voltage ladder 20 is enlarged and shown in more detail. In the specific embodiment being described herein, second group of voltage comparators 16 includes 17 voltage comparators (labelled 16A through 16Q), only nine of which are illustrated in FIG. 2. Also, reference voltage ladder 20 has eight fine sections or fine resistors, (A1 through A8, B1 through B8, etc.). Each fine resistor A1 through H8 has two electronic switches associated therewith, each of which has one terminal connected to opposite sides of the fine resistor (except for the five fine resistors adjacent each end of reference ladder 20) and the other terminal connected to the signal input of one of the voltage comparators 16A through 16Q. The control lines 36 from the output of MSB encoder 14 to the control inputs of the electronic switches are labelled 36A through 36H.

The operation of the circuit is as follows. On the first clock cycle, first group of voltage comparators 12 compare the unknown voltage level (analog signal) on terminal 30 to the eight coarse voltage levels provided by the reference voltage ladder 20 and signals are supplied to MSB encoder 14 indicating which voltage comparator of first group 12 has a reference voltage applied thereto (coarse step) that most nearly approximates the unknown voltage. MSB encoder 14 supplies this information to MSB correction circuit 24 and, on the control lines 36, to the control inputs of various electronic switches in network 22. The electronic switches which are energized by the control signals from MSB encoder 14 connect the second group of voltage comparators 16 to the fine steps contained within the selected coarse step and to one half of the fine steps in each coarse step adjacent to the selected coarse step. Assuming, for example, that the coarse step selected is 20C in FIG. 2, the voltage comparator in first group 14 corresponding to this step supplies a control voltage on control line 36C, which activates (closes) all switches connected to line 36C. From FIG. 2 it can be seen that every other switch in line 20C (beginning with the first switch on the left) is connected to control line 36C. Thus, first fine resistor C1 in line 20C is connected to voltage comparator 16F, second fine resistor C2 is connected to voltage comparator 16G, etc. until last fine resistor C8 in line 20C is connected to voltage comparator 16L. Also, control line 36C is connected to five switches in line 20B associated with the first five fine resistors, B1 through B5, and to five switches in line 20D associated with the last five fine resistors, D4 through D8. As can be seen in FIG. 2, the switches in line 20B activated by control line 36C connect fine resistor B1 to voltage comparator 16E, fine resistor B2 to voltage comparator 16D, etc., until fine resistor B5 is connected to voltage comparator 16A. Similarly, fine resistors D4 through D8 are connected to voltage comparators 16M through 16Q.

Figure 3:
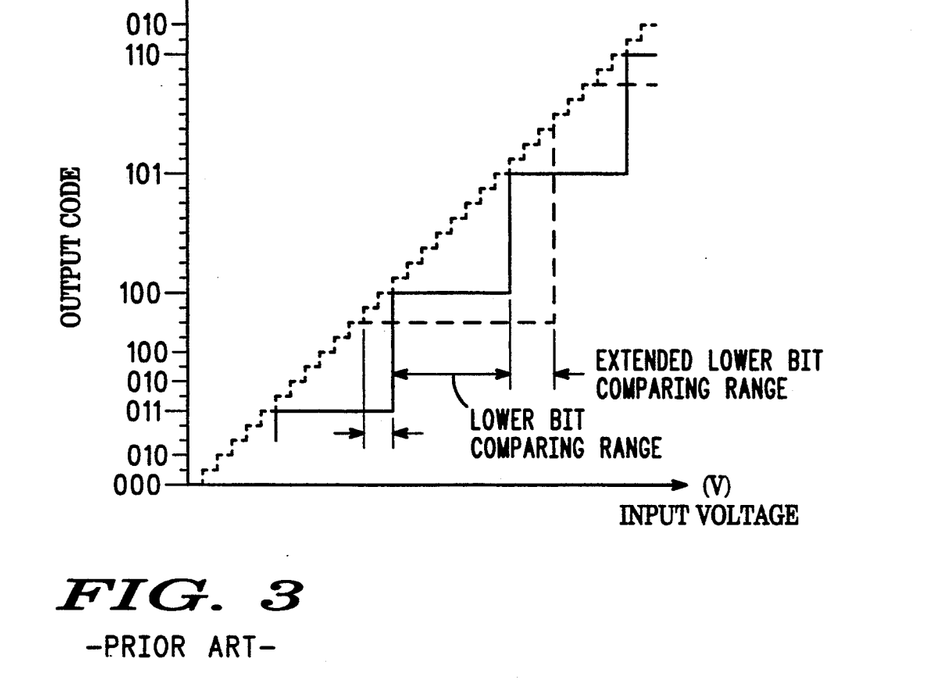
FIG. 3 is a graphical representation of several coarse steps and the fine steps therein for an A/D converter, illustrating the coverage of comparators provided by prior art multiple-clock-cycle subranging A/D converters.

Referring to FIG. 3, a graphical representation of the coarse and fine step coverage in prior art A/D converters is illustrated. A six bit accuracy A/D converter is illustrated for convenience in comparison. As can be seen from this graph, the fine steps in the prior art structure extend across the selected coarse step (e.g. 100) and, additionally, for two fine steps on the lower end (110 and 111) and three fine steps on the upper end (001, 010 and 011). However, this leaves three steps in the middle of each coarse step that are not included, leaving room for errors in the system. For example, if the coarse voltage comparators indicate that the unknown voltage lies between 100 and 101, because of tolerances and minor noise errors, the actual fine step could be below 100110 or above 101011. In this case the fine comparators would not be able to make a comparison on the second clock cycle. In many instances, because of inaccurate coarse resistors, changing reference voltages, noise, etc. the MSB comparison can be more than three fine steps away from the actual unknown voltage. As long as the actual signal remains at this level and the MSB portion of the A/D converter indicates a higher or lower coarse step, the output will be in error.

Figure 4:
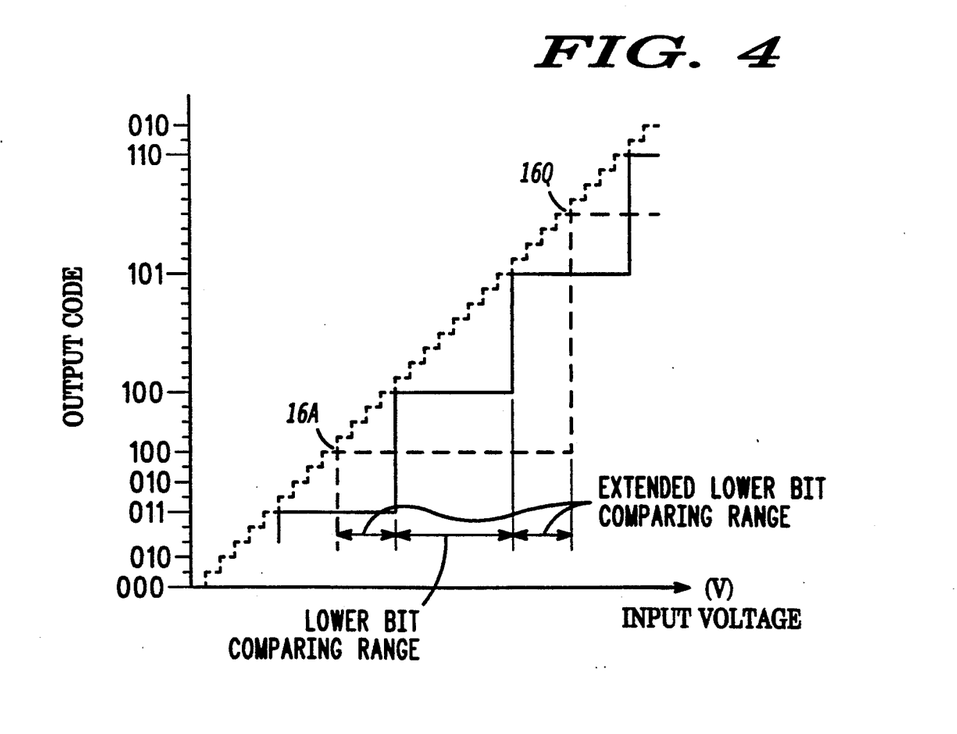
FIG. 4 is a graphical representation similar to FIG. 3 illustrating the coverage of the comparators provided by the present invention.

To overcome this problem, the present invention includes fine voltage comparators that extend across the selected coarse step and from approximately the center of each adjacent coarse step so that no fine steps are missed, as illustrated in FIG. 4. If the first group of voltage comparators 12 and MSB encoder 14 indicate that the unknown voltage supplied to terminal 30 lies between coarse steps 100 and 101, a control signal is supplied to switching network 22 which connects the second group of voltage comparators 16 to fine steps 100100 (voltage comparator 16A) through 101100 (voltage comparator 16Q). Thus, the entire range of fine steps is covered and no errors can occur because of too great a tolerance and/or noise in the MSB portion of the determination. It will of course be understood that while the present embodiment illustrates and describes the fine comparisons extending from approximately the middle of each adjacent step, the fine comparisons could extend from any selected mid point in adjacent coarse steps as long as they cover at least two complete coarse steps. In this fashion the fine steps will always overlap and cover the entire range. It is, however, preferable to extend the fine steps to approximately the middle of adjacent coarse steps to eliminate reoccurring tolerance problems.

Figure 5:
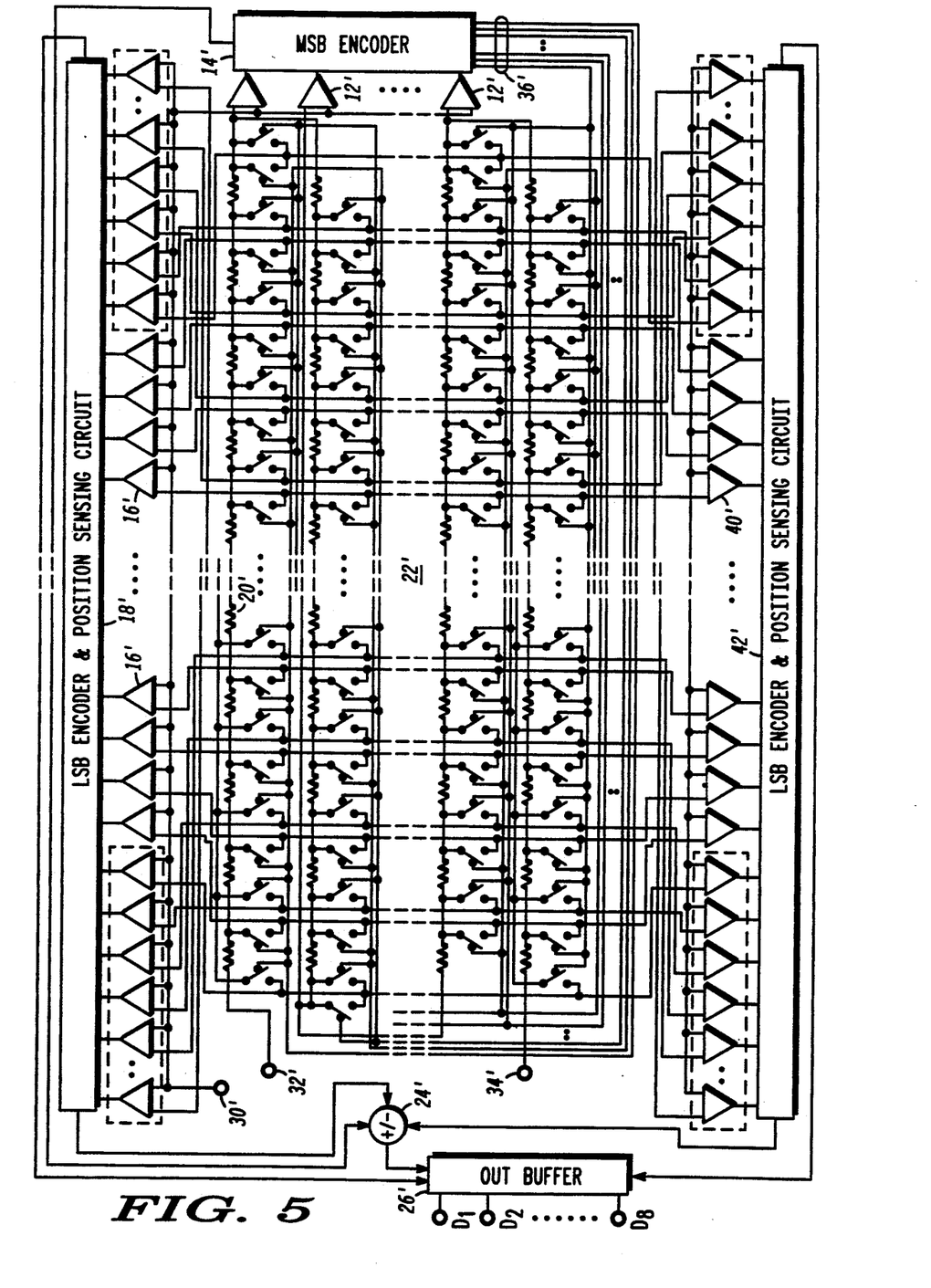
FIG. 5 is a schematic diagram of another embodiment of a multiple-clock-cycle subranging A/D converter embodying the present invention.

Referring specifically to FIG. 5, another embodiment of the present invention is illustrated in which the entire two-clock-cycle subranging A/D converter operates nearly as fast as a one-clock-cycle flash type of A/D converter. In this embodiment, components which are similar to those in FIG. 1 are designated with similar numbers and a prime is added to indicate the different embodiment. A first group of voltage comparators 12' is connected to a reference voltage ladder 20' as described in the first embodiment. A second group of voltage comparators 16' is connected to reference voltage ladder 20' by switching network 22', as described in conjunction with the embodiment of FIG. 1. A third group of voltage comparators 40' is connected to reference voltage ladder 20' by switching network 22' exactly as the second group of voltage comparators 16' is connected. Third group of voltage comparators 40' are connected to a second LSB encoder 42' which in turn supplies an output signal to an MSB correction circuit 24' and to an output buffer 26'. The timing signals supplied to the third group of voltage comparators 40' are 180 degrees out of phase with the timing signals supplied to the second group of voltage comparators 16'.

In the operation of the embodiment illustrated in FIG. 5, on the first clock pulse the first and second groups of voltage comparators 12' and 16' sample the unknown voltage applied to input terminal 30' and are autozeroed by the sample. During this first clock pulse the first group of voltage comparators 12' determine an MSB (coarse) reading and, through encoder 14', supply control signals that connect the second group of voltage comparators 16' to the appropriate fine resistors in reference voltage ladder 20'. When a second clock pulse is applied to the circuit, the second group of voltage comparators 16' determines the LSB reading, corrects the MSB reading in MSB correction circuit 24' (if necessary) and supplies a multiple digit output signal to output buffer 26'. Also, during the second clock pulse, the first and third groups of voltage comparators 12' and 40' sample the unknown voltage at input terminal 30' and are autozeroed by the second sample. During the second clock pulse, the first group of voltage comparators 12' determines an MSB reading for the second sample and, through encoder 14', connects the third group of voltage comparators 40' to the appropriate fine resistors in reference ladder 20'. When a third clock pulse is applied to the circuit, the third group of voltage comparators 40' determines the LSB reading for the second sample, corrects the MSB reading in MSB correction circuit 24' (if necessary) and supplies a multiple digit output signal to output buffer 26'. Also during the third clock pulse, the first and second groups of voltage comparators 12' and 16' sample the unknown voltage at input terminal 30' and are autozeroed by the third sample. This procedure continues, with first group of voltage comparators 12' providing an MSB output for each clock pulse and second and third groups of voltage comparators 16' and 40' alternately providing an LSB output on every clock pulse. The timing described herein can be accomplished very simply by supplying the same timing signals to the second and third groups of voltage comparators, 16' and 40', respectively, except that all timing signals are inverted before being applied to one of the groups of comparators 16' or 40'. Thus, a complete digital reading is supplied on every clock pulse (after the first clock pulse) instead of every other clock pulse as in prior art two-clock-cycle subranging A/D converters.

Figure 6:
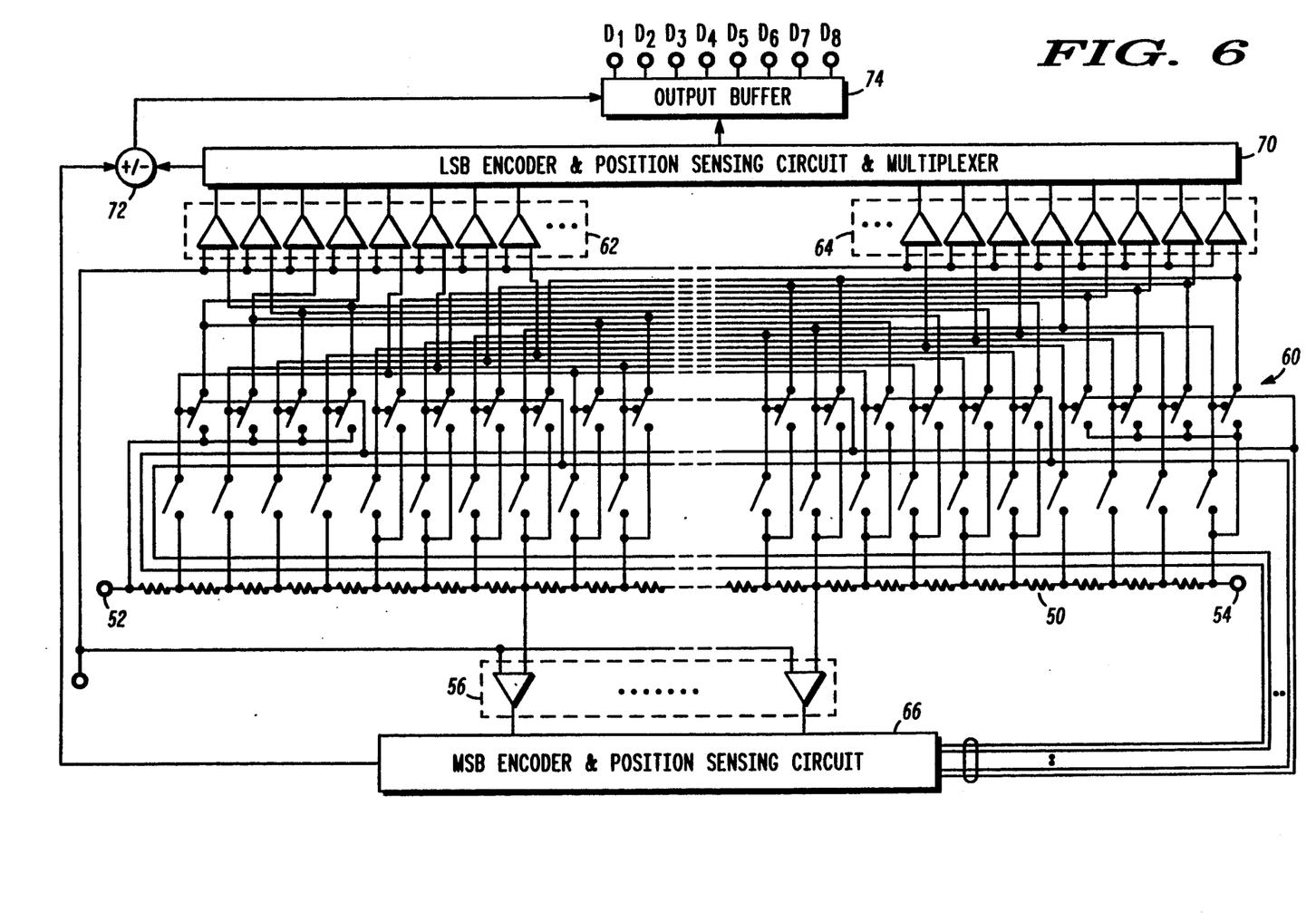
FIG. 6 is a schematic diagram similar to FIG. 5 of another embodiment of a multiple-clock-cycle subranging A/D converter embodying the present invention.

Referring specifically to FIG. 6, another embodiment of the present invention is illustrated, wherein a multiple-clock-cycle subranging A/D converter similar to that illustrated in FIG. 5 is disclosed. In this embodiment, a reference voltage ladder 50 is provided which includes eight coarse steps and eight fine steps between each coarse step. The reference voltage ladder is actually a resistance ladder formed by providing a fine resistor for each fine step thereof, with all of the resistors being connected in a series combination and first and second reference voltages, 52 and 54, connected to opposite ends thereof. A first group of voltage comparators 56 is connected to reference voltage ladder 50, one comparator of the group being connected to each coarse step thereof. A switching network 60 is connected to reference voltage ladder 50 and to a second group of voltage comparators 62 and a third group of voltage comparators 64. In this embodiment second and third groups of voltage comparators 62 and 64 each include a number of comparators equal to twice the number of fine steps in each of the coarse steps of reference voltage ladder 50, to provide the increased accuracy described in conjunction with the embodiment of FIG. 1. Also, switching network 60 alternately connects either the second or the third group of voltage comparators, 62 or 64, to fine steps of reference voltage ladder 50 which are selected by an MSB encoder 66, as described in conjunction with the embodiment of FIG. 5. An LSB encoder 70 is connected to receive output signals from second and third groups of voltage comparators 62 and 64. In this embodiment LSB encoder 70 is illustrated as a single encoder which provides the functions of two encoders, rather than illustrating two encoders as shown in FIG. 5, since a single encoder might be utilized for the dual purpose and simply switched (multiplexed) between groups of voltage comparators. The outputs of MSB encoder 66 and LSB encoder(s) 70 are supplied to an upper bit correction circuit 72 and, ultimately, to an output buffer 74.

All of the resistors of reference voltage ladder 50 are positioned on a semiconductor chip in a first common area, basically as shown in FIG. 6, rather than being intermixed with switching network 60 as shown in FIG. 5. Also, switching network 60 is positioned in a second common area on the semiconductor chip. First group of voltage comparators 56 is positioned in a third common area on a different side of reference voltage ladder 50 (the first common area) from switching network 60 (the second common area). Second and third groups of voltage comparators 62 and 64 are positioned in a fourth common area on a different side of switching network 60 (the second common area) from reference voltage ladder 50 (the first common area). Thus, none of the leads from the various components cross reference voltage ladder 50 and switching noise is not introduced therein. Further, noise from the operation of switching network 60 is not introduced into reference voltage ladder 50 by stray capacitance and the like between the various switches and the resistance ladder.

Figure 7:
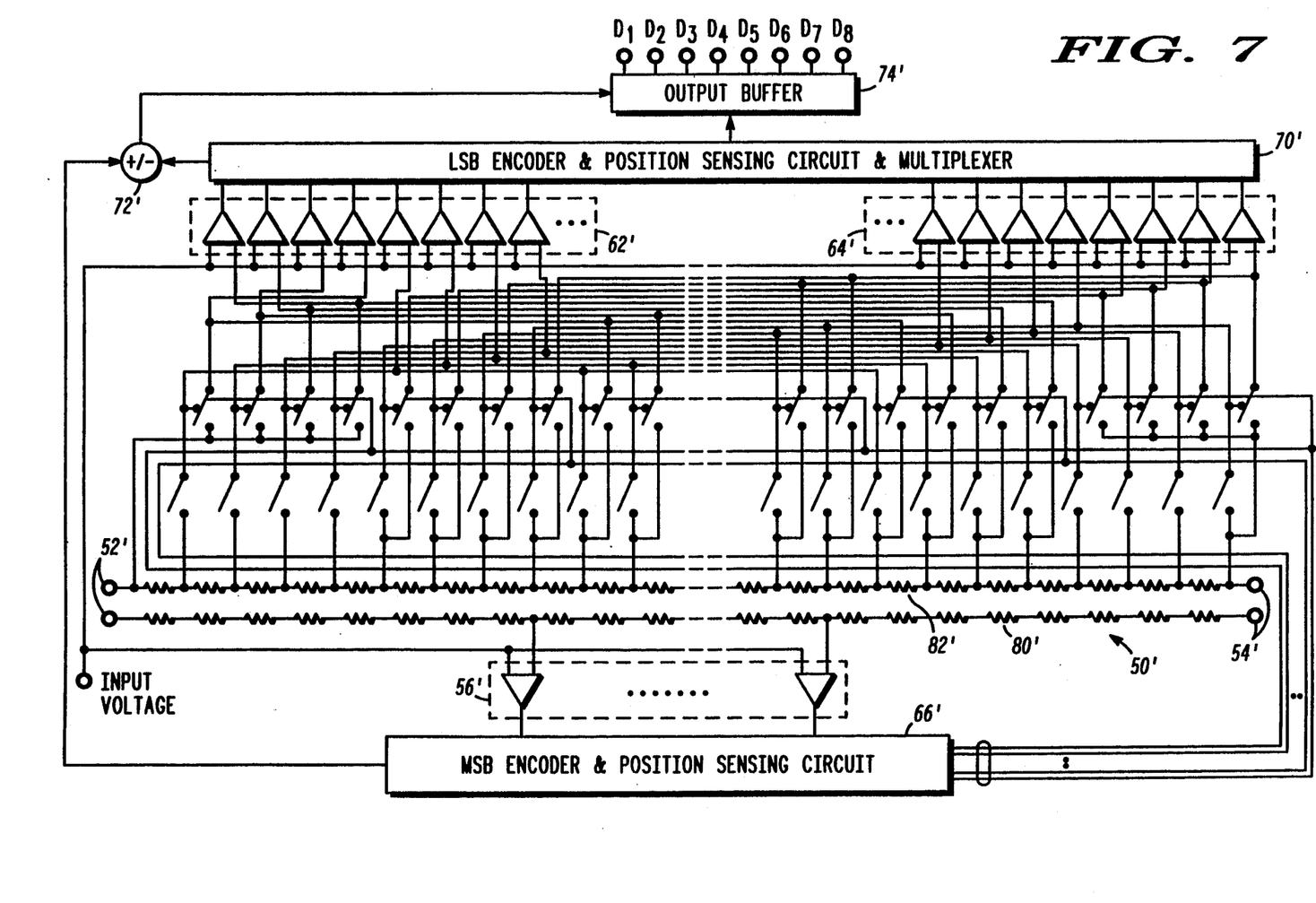
FIG. 7 is a schematic diagram similar to FIG. 6 of another embodiment of a multiple-clock-cycle subranging A/D converter embodying the present invention.

Referring specifically to FIG. 7, another embodiment of the present invention is illustrated. In this embodiment components which are similar to those in FIG. 6 are designated with similar numbers and a prime is added to indicate the different embodiment. In this embodiment the resistance ladder forming reference voltage ladder 50' is formed with a coarse section 80' connected between first and second reference voltage inputs 52' and 54'. The coarse steps formed by coarse section 80' are connected directly to first group of voltage comparators 56'. Resistance ladder 50' also has a fine section 82' connected between first and second reference voltage inputs 52' and 54'. The fine steps formed by fine section 82' are selectively connected to second and third groups of voltage comparators 62' and 64' by switching network 60'. Since coarse section 80' is not connected to fine section 82', it may be located physically in a different area of the semiconductor chip or, if it is convenient in the production, it may be located in the first common area with coarse section 80'. By forming separate coarse and fine sections 80' and 82' in reference voltage ladder 50', loading produced by the operation of the voltage comparators has less effect and the accuracy of reference voltage ladder 50' increases.

Thus, a new and improved multiple-clock-cycle subranging type of A/D converter is disclosed in which openings in the fine step coverage are eliminated to reduce the number of times that comparisons between the reference voltage ladder and the unknown voltage can not be made. Also, the components of the A/D converter are arranged to eliminate the introduction of switching noise into the reference voltage ladder. It will be apparent to those skilled in the art that the described A/D converter will produce fewer errors and is a more accurate subranging A/D converter than prior art structures. It will also be apparent that the present subranging A/D converter can be constructed to operate nearly as fast as a one-clock-cycle flash type of A/D converter. Also, while a two-clock-cycle subranging A/D converter has been described herein, it will be understood that other multiple-clock-cycle subranging type A/D converters can be similarly improved. Further, while the present invention uses more voltage comparators than prior art two-clock-cycle subranging A/D converters, it uses less voltage comparators than one-clock-cycle flash type A/D converters and is much more accurate than either prior art type while being almost as fast as the one-clock-cycle flash type A/D converter.

While we have shown and described specific embodiments of the present invention, further modifications and improvements will occur to those skilled in the art. We desire it to be understood, therefore, that this invention is not limited to the particular forms shown and we intend in the appended claims to cover all modifications which do not depart from the spirit and scope of this invention.

What we claim is:

1. A multiple-clock-cycle subranging type analog-to-digital converter comprising:
    a plurality of voltage comparators;
    a reference voltage ladder having a plurality of coarse steps and a plurality of fine steps within the coarse steps, a first group of said voltage comparators being connected to the plurality of coarse steps;
    a signal input connected to said plurality of voltage comparators for receiving unknown input voltages;
    electronic switches connected to a second group of said voltage comparators and said reference voltage ladder;
    an MSB encoder connected to the first group of said voltage comparators and to said electronic switches, said MSB encoder receiving signals from the first group of said voltage comparators indicative of the approximate coarse step which coincides with an unknown voltage applied to said signal input and energizing said electronic switches to connect the second group of said voltage comparators to the fine steps of said reference voltage ladder within and adjacent the indicated approximate coarse step, the second group of said voltage comparators and the connected fine steps of said reference voltage ladder including twice as many fine steps as are included in a single coarse step and extending from a mid-point of each coarse step adjacent the indicated approximate coarse step;
    an LSB encoder connected to the second group of said voltage comparators; and
    an output buffer coupled to said MSB encoder and said LSB encoder for providing a multiple bit digital output signal which is indicative of the level of the unknown input voltage applied to said signal input.

2. An analog-to-digital converter as claimed in claim 1 wherein the voltage comparators are the chopper type voltage comparators including a sample hold circuit.

3. An analog-to-digital converter as claimed in claim 1 wherein each coarse step of the reference voltage ladder is divided into an equal number of fine steps.

4. An analog-to-digital converter as claimed in claim 1 wherein the electronic switches are the transmission gate type and the converter is integrated on a single semiconductor chip.

5. An analog-to-digital converter as claimed in claim 5 wherein the reference voltage ladder is formed of a plurality of resistors, at least one for each of the fine steps, connected into a resistance ladder, said plurality of resistors being positioned in a first common area on a semiconductor chip and the electronic switches being positioned on the same semiconductor chip with connecting leads between the electronic switches and the plurality of resistors positioned so as not to cross the resistance ladder.

6. An analog-to-digital converter as claimed in claim 1 including in addition a third group of voltage comparators, equal in number to the second group of voltage comparators, connected through the electronic switches to the fine steps of said reference voltage ladder, and a second LSB encoder connected to said third group of voltage comparators and to said output buffer, said MSB encoder controlling said electronic switches to cause said second group of voltage comparators to operate on a first unknown input voltage to find the correct fine step while said first group of voltage comparators are operating on a second unknown input voltage to find the approximate coarse step and to cause said third group of voltage comparators to operate on said second unknown input voltage to find the correct fine step while the first group of voltage comparators are operating on a third unknown input voltage to find the approximate coarse step.

7. In a multiple-clock-cycle subranging type of analog-to-digital converter including a plurality of voltage comparators, a reference voltage ladder having a plurality of coarse steps and a plurality of fine steps within the coarse steps with a first group of the voltage comparators being connected to the plurality of coarse steps, a signal input for receiving unknown input voltages connected to the plurality of voltage comparators, and electronic switches connected to a second group of said voltage comparators and said reference voltage ladder, a method of converting an unknown input voltage to a multiple bit digital signal comprising the steps of:

supplying a first unknown voltage to the signal input;
sampling the first unknown voltage in the plurality of voltage comparators, autozeroing the first and second groups of voltage comparators with the sample, comparing the sample to each of the coarse steps of the voltage ladder in the first group of voltage comparators and providing a coarse output signal indicative of the particular coarse step of the reference voltage ladder which approximately matches the first unknown voltage;
connecting the second group of voltage comparators, which includes twice as many plus one voltage comparators as the number of fine steps in a single coarse step, to the fine steps of the reference voltage ladder from a mid-point in the coarse step immediately below the particular coarse step, through the particular coarse step and to a mid-point in the coarse step immediately above the particular coarse step;
comparing the sample to each of the connected fine steps of the voltage ladder in the second group of voltage comparators and providing a fine output signal indicative of the particular fine step of the reference voltage ladder which compares to the first unknown voltage; and
utilizing the coarse output signal and the fine output signal to provide a multiple bit digital output signal.

8. In a multiple-clock-cycle subranging type of analog-to-digital converter including a plurality of voltage comparators, a reference voltage ladder having a plurality of coarse steps and a plurality of fine steps within the coarse steps with a first group of the voltage comparators being connected to the plurality of coarse steps, a signal input for receiving unknown input voltages connected to the plurality of voltage comparators, electronic switches connected to second and third groups of said voltage comparators and said reference voltage ladder, a method of converting an unknown input voltage into a multiple bit digital signal comprising the steps of:

supplying a first unknown voltage to the signal input;
sampling the first unknown voltage in the first group of voltage comparators and in the second group of voltage comparators, autozeroing the first and second groups of voltage comparators with the first sample, comparing the first sample to each of the coarse steps of the reference voltage ladder in the first group of voltage comparators and providing a coarse output signal indicative of the particular coarse step of the reference voltage ladder which approximately matches the first unknown voltage;
activating electronic switches to connect the second group of voltage comparators to the fine steps of the reference voltage ladder from a mid-point in the coarse step immediately below the particular coarse step, through the particular coarse step and to a mid-point in the coarse step immediately above the particular coarse step;
supplying a second unknown voltage to the signal input;
sampling the second unknown voltage in the first and third groups of voltage comparators, and simultaneously autozeroing the first and third groups of voltage comparators with the second sample, comparing the first sample to each of the connected fine steps of the reference voltage ladder in the second group of voltage comparators and providing a fine output signal indicative of the particular fine step of the reference voltage ladder which compares to the first unknown voltage and simultaneously comparing the second sample to each of the coarse steps of the reference voltage ladder in the first group of voltage comparators and providing a second coarse output signal indicative of the second particular coarse step which approximately matches the second unknown voltage;
activating electronic switches to disconnect the second group of voltage comparators from the reference voltage ladder and connect the third group of voltage comparators to the fine steps of the reference voltage ladder from a mid-point in the coarse step immediately below the second particular coarse step, through the second particular coarse step and to a mid-point in the coarse step immediately above the second particular coarse step;
applying a third unknown voltage to the signal input;
sampling the third unknown voltage in the first and second voltage comparators and simultaneously autozeroing the first and second groups of voltage comparators with the third sample, comparing the second sample to each of the connected fine steps of the voltage ladder in the third group of voltage comparators and providing a fine output signal indicative of the particular fine step of the reference voltage ladder which compares to the second unknown voltage and simultaneously comparing the third sample to each of the coarse steps of the reference voltage ladder in the first group of voltage comparators and providing a third coarse output signal indicative of the third particular coarse step which approximately matches the third unknown voltage;
utilizing the coarse output signals and the fine output signals to provide a multiple bit digital output signal.

9. A method as claimed in claim 8 wherein the steps of comparing in each of the second and third groups of voltage comparators includes utilizing twice as many plus one voltage comparators in the second and third groups as there are fine steps in a single coarse step.

10. A multiple-clock-cycle subranging analog-to-digital converter including a plurality of voltage comparators, reference voltage ladder means having a plurality of coarse steps and a plurality of fine steps within the coarse steps, a first group of said voltage comparators being connected to the plurality of coarse steps, a signal input connected to said plurality of voltage comparators for receiving unknown input voltages, electronic switches connected to a second group of said voltage comparators and said reference ladder means, an MSB encoder connected to the first group of said voltage comparators and to said electronic switches, said MSB encoder receiving signals from the first group of said voltage comparators indicative of the approximate coarse step which coincides with an unknown voltage applied to said signal input and energizing said electronic switches to connect the second group of said voltage comparators to the fine steps of said reference voltage ladder means within and adjacent the indicated approximate coarse step, an LSB encoder connected to the second group of said voltage comparators, and an output buffer coupled to said MSB encoder and said LSB encoder for providing a multiple bit digital output signal which is indicative of the level of the unknown input voltage applied to said signal input, said reference voltage ladder means comprising:

a plurality of resistors, at least one for each of the fine steps, connected into a fine resistance ladder, said resistors being positioned in a first common area on a semiconductor chip and the electronic switches being positioned in a second common area on the same chip so that connecting leads therebetween do not cross the fine resistance ladder, and said reference voltage ladder means further including a second plurality of resistors, at least one for each coarse step of said reference voltage ladder means, connected into a coarse resistance ladder electrically separate from said fine resistance ladder, with each of the first group of voltage comparators being connected to a different coarse step of the coarse resistance ladder, the first group of voltage comparators being positioned in a third common area on the same semiconductor chip, the third common area being on a different side of the first common area from the second common area so that leads connecting the first group of voltage comparators to the coarse resistance ladder do not cross either the first or the second resistance ladder.

11. A multiple-clock-cycle subranging analog-to-digital converter as claimed in claim 10 wherein the second plurality of resistors is positioned in the first common area on the same semiconductor chip.

12. In a multiple-clock-cycle subranging analog-to-digital converter integrated circuit including a plurality of voltage comparators, reference voltage ladder means having a plurality of coarse steps and a plurality of fine steps within the coarse steps with a first group of the voltage comparators being connected to the plurality of coarse steps and a second group of the voltage comparators being selectively connected to the reference voltage ladder means by a plurality of electronic switches, a method of forming the converter on a single semiconductor chip comprising the steps of:

positioning the plurality of switches on the semiconductor chip in a first area;

positioning a plurality of resistors, including at least one resistor for each fine step of the reference voltage ladder means, in a fine resistance ladder in a second area on the semiconductor chip so that leads connecting the plurality of switches to the fine resistance ladder do not cross the fine resistance ladder;

forming the coarse steps with a separate plurality of coarse resistors connected into a coarse resistance ladder, electrically separate from the fine resistance ladder, in the second area on the semiconductor chip; and positioning the first group of voltage comparators on the semiconductor chip in a third area so that leads connecting the first group of voltage comparators to the coarse resistance ladder do not cross the coarse resistance ladder.

* * * * *